May 19, 1970 C. B. LEUTHAUSER 3,513,406

RF POWER AMPLIFIER

Filed Dec. 31, 1968

INVENTOR
CHARLES B. LEUTHAUSER
BY Edward J. Norton
ATTORNEY

United States Patent Office — 3,513,406 — Patented May 19, 1970

3,513,406

RF POWER AMPLIFIER

Charles B. Leuthauser, Oldwick, N.J., assignor to RCA Corporation, a corporation of Delaware Filed Dec. 31, 1968, Ser. No. 788,198
Int. Cl. H03f 3/04
U.S. Cl. 330—40 6 Claims

ABSTRACT OF THE DISCLOSURE

An RF power amplifier circuit includes a compensating network which, by changing the bias of the amplifier, changes the class of operation at different power levels. The amplifier gain is made constant over a wide range of signal levels by operation of the amplifier in class B at low levels and class C at higher levels.

This invention relates to a linear or constant gain RF power amplifier wherein the gain of the amplifier is made constant over a wide range of signal levels.

The conventional method of achieving a linear or constant gain RF power amplifier is to operate a transistor in a class A or class AB mode. Class A or class AB mode of operation has several disadvantages for power amplification over class B or class C operation. One advantage of operating at class B or class C over class A or class AB is that the amplifier does not run away thermally, because the base-emitter junction is never biased in a manner to cause quiescent current draw. Another advantage of operating between class B and class C is that the amplifier operates at higher collector efficiencies than with class A or class AB with the attendent advantage of low power dissipation.

It is therefore an object of the present invention to provide a more linear RF amplifier which has constant gain over a wide range of signal levels and which operates between class B and C mode of operation.

A biasing network includes a diode coupled between the base and emitter electrodes of an RF transistor amplifier. At low input power level, the diode is non-conducting, and a voltage source and resistor across the diode control the base-to-emitter bias of the transistor amplifier to provide the necessary bias for operation in class B. As the RF input power to the base of the transistor increases, rectified base current opposes the fixed class B bias and provides a transition to class C operation, wherein at high input RF power levels the diode is biased to conduct and provides a fixed bias for class C operation.

A more detailed description follows in conjunction with the drawing in which.

Figures 1, 2, 3:
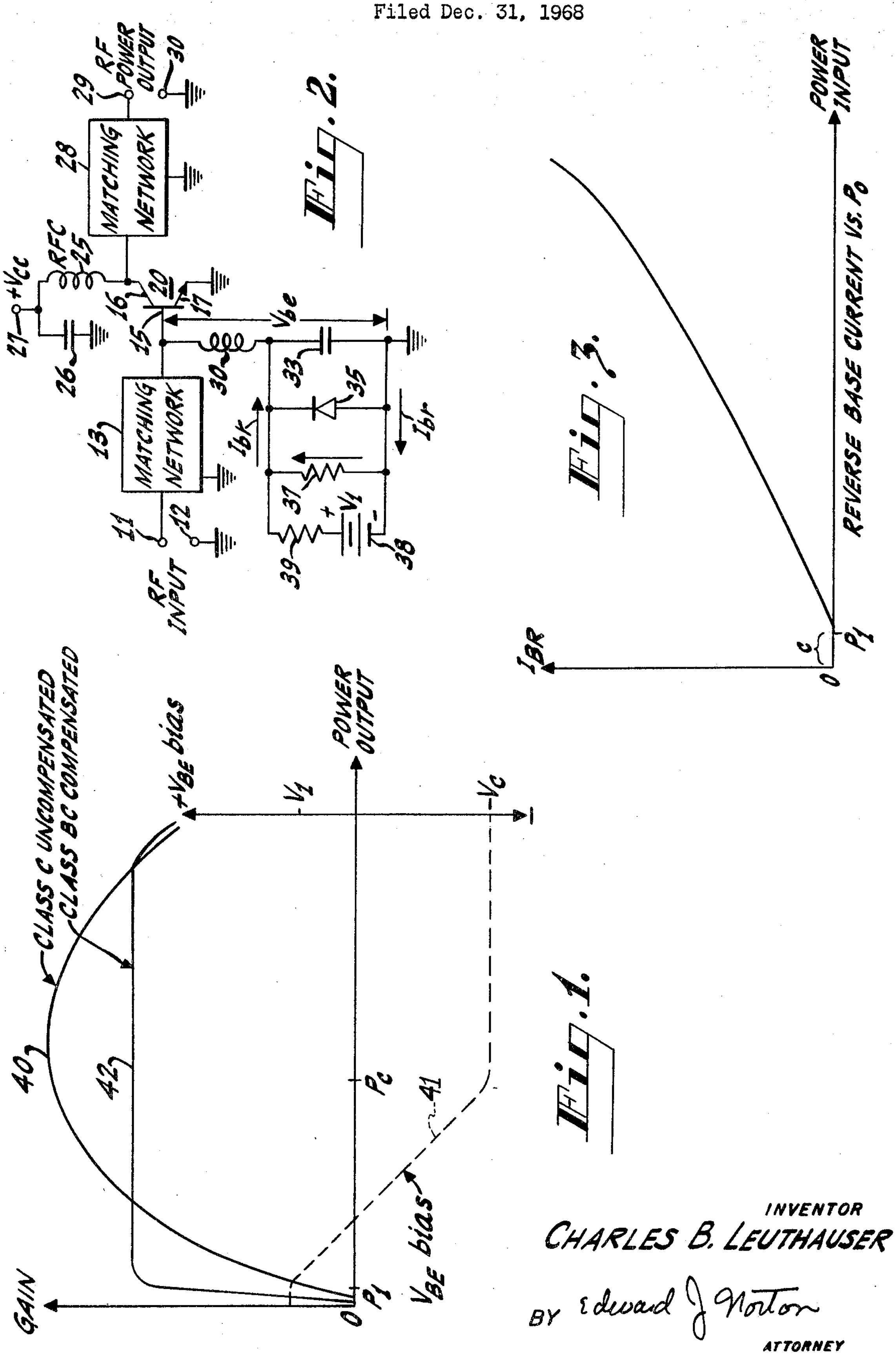
FIG. 1 is a curve illustrating the overall performance and characteristics of the improved amplifier and an uncompensated typical class C amplifier.
FIG. 2 is a schematic diagram of the improved RF amplifier circuit which operates between class B and class C mode of operation.
FIG. 3 is a curve illustrating rectified base current vs. power input for the arrangement shown in FIG. 2.

FIG. 2 shows an RF amplifier in accordance with an embodiment of the present invention wherein the RF signal input is applied across terminals 11 and 12. The RF input signal across terminals 11 and 12 is applied through an input matching network 13 to the base 15 of NPN power transistor 20 having base 15, collector 16 and emitter 17 electrodes. The emitter 17 of NPN transistor 20 is coupled to a point of reference potential. D.C. bias is provided by $+V_{cc}$ voltage at terminal 27 and is applied to collector electrode 16 through the RF decoupling system including RF choke coil 25 and capacitor 26. The output of the NPN transsitor 20 is coupled through an output matching network 28 to a pair of output terminals 29, 30. A compeensating self-biasing network includes RF choke coil 30, capacitor 33, diode 35, resistor 37 and voltage source 38, 39. In the arrangement shown in FIG. 2, the diode 35, resistor 37, and the voltage source 38 are each individually coupled across capacitor 33. Capacitor 33 is connected in series with the coil 30 between the base 15 and the point of reference potential. The initial bias for class B operation is provided by voltage source 38 which is poled as shown in FIG. 2 with the positive side coupled through resistor 39 to the cathode of the diode 35.

In the operation of a typical uncompensated class C operated amplifier, the gain of the amplifier initially increases non-linearly with increased power output of the amplifier as shown by curve 40 of FIG. 1. The gain of the amplifier decreases beyond the approximate point $P_c$ of the power output as shown in FIG. 1. In the operation of the arrangement shown in FIG. 2, at the low input power level of the RF signal input, the diode 35 is nonconducting and the transistor 20 is biased by the voltage source 38 $(V_1)$ in class B operation. In other words, the voltage $V_1$ from voltage source 38 is insufficient alone to forward bias the transistor. Upon the application of an RF input signal thereto, the transistor conducts for approximately one-half cycle of the RF input signal. The gain increases rapidly with the increasing power output level. As the level of the input RF signal applied across terminals 11 and 12 becomes substantially greater so as to provide a power output beyond point $P_1$ in FIG. 1, a rectified voltage at the base 15 of transistor 20 is developed which results from the base-emitter rectification of the higher level RF input signal. This rectified voltage at the base produces a rectified base current $I_{br}$ which flows in the direction of the arrows in FIG. 2. The RF choke coil 30 and capacitor 33 act to isolate the compensation network from the RF input signal at the base and allow the D.C. rectified base current to pass through the compensation network. As the level of the RF input signal increases, likewise the rectified base current increases as shown in FIG. 3. It is noted that beyond point $P_1$ (region C) where the RF input signal level is of sufficient magnitude to provide the rectified base current, the rectified base current increases substantially linear with the amount of input power. Since this current changes linearly as a function of power input, a compensation network responsive to this current will likewise change as a function of power input. In the arrangement of FIG. 2, as the power input increases, and consequently the rectified base current $(I_{br})$ increases, the voltage drop across resistor 37 in the compensation network increases. The voltage drop across resistor 37 opposes the polarity of bias source 38, whereby the net bias voltage $V_{be}$ changes in a negative direction as illustrated by dashed line 41 of FIG. 1. As the net bias voltage $V_{be}$ continues to change in a negative direction with increasing power level, the transistor 20 is biased further into class C mode of operation. The effect of the change in the net bias voltages is to maintain the gain substantially constant as the power level increases beyond point $P_1$. When the power output level increases beyond point $P_c$ in FIG. 1 such that the net bias voltage $(V_{be})$ [the source voltage $(V_1)$ minus the voltage drop across resistor 37 $(I_{br}R_s)$] becomes sufficiently negative $(-V_c)$, the diode 35 is forward biased and conducts. Upon the power output level exceeding this $P_c$ level, the transistor 20 remains biased at the given level of class C mode of operation at which the diode 35 is forward biased. The diode 35 is forward biased and conducts at a power output level when in an uncompensated class C amplifier the self-bias produced would result in decreasing gain for further increase in the power output level. The conduction of the diode 35 sets the emitter-base bias at a level which maintains the gain constant for power output levels beyond the point $P_c$. Thus in the manner described above a nearly constant gain over a relatively wide range of power levels is provided as illustrated by line 42 of FIG. 1.

A separate bias source (not shown) may be coupled between the anode of diode 35 and the point of reference potential to set the conduction point of the diode 35. Where desired, the voltage source 38 may be replaced by a resistor divider network between the terminal 27 and the point of reference potential. While an NPN transistor circuit is shown, a PNP transistor circuit may likewise be employed by reversing the biasing voltage 27, 28 and the direction of the diode 35 in a known manner.

A substantially constant gain was provided in an arrangement where the components had the following values:

Transistor—2N5016 operated at a frequency of 400 mHz.,
Voltage source $V_{cc}$=28 volts,
Resistor 37—50 ohms,
Resistor 39—1.6 kilo ohms,
Voltage source 38=6 volts,
Capacitor 33=0.03 microfarad,
Coil 30=0.22 microhenry The gain was substantially constant at an output level from 0.5 watt to 12 watts. An amplifier circuit as described is particularly suited for the output stage of an AM (amplitude modulated) transmitter. Since the operation of the circuit is between class B and class C mode of operation, the overall efficiency both as an amplifier and as a modulator is high and the transmitter requires less supply power to obtain the same level of performance.

What is claimed is:

1. A power amplifier having a constant gain over a substantially wide range of power levels comprising:

a current conducting device having an input, output and common electrodes, means coupled between said input and common electrodes for applying RF input signals thereto, means coupled to said electrodes for biasing said electrodes so as to place said amplifier initially into class B operation, said biasing means including a self-biasing network coupled between said input and common electrodes responsive to the level of said RF input signals applied to said current conducting device for changing the D.C. bias of said current conducting device between class B and class C operation and for maintaining said D.C. bias at a given class C level when said RF input signals exceed a given signal level.

2. An improved linear transistor power amplifier having a constant gain over a wide range of power levels comprising:

a transistor having a base, emitter and collector electrodes, means coupled between said base and emitter electrodes for applying RF input signals thereto, the base emitter junction of said transistor in response to high level RF input signals providing a rectified voltage at the base of said transistor, means coupled to said electrodes for D.C. biasing said electrodes so as to place said transistor into class B mode of operation, said biasing means including a self-biasing network D.C. coupled between said base and emitter electrodes, said self biasing network responsive to the rectified base current resulting from said rectified voltage at the base to change the biasing level of said transistor from class B to class C operation upon the application of high level RF input signals and for clamping the bias of said transistor at a given class C level when said high level RF input signal exceeds a given level.

3. The combination as claimed in claim 2 wherein said biasing network includes a resistor coupled in said network to provide a voltage in response to the flow of said rectified base current through said resistor which opposes said class B bias and changes the bias of said transistor to class C mode operation.

4. The combination as claimed in claim 3 wherein said self biasing network includes a diode coupled across said resistor so that when said voltage provided by said resistor resulting from increased RF input signal level exceeds a given value said diode is forward biased thereby clamping said transistor at a given class C operating level for said RF input signals exceeding that level.

5. The combination as claimed in claim 4 wherein said network includes a capacitor and coil in series between said base electrode and said emitter electrode, said diode and said resistor each being individually connected across said capacitor.

6. The combination a claimed in claim 4 wherein said transistor is an NPN transistor, the cathode of said diode being coupled to said base electrode and the anode of said diode being coupled to said emitter electrode.

References Cited

UNITED STATES PATENTS 3,374,442 3/1968 Griffin ---------------- 330—40

ROY LAKE, Primary Examiner

J. B. MULLINS, Assistant Examiner

U.S. Cl. X.R.

330—22, 204